US011841330B2

(12) United States Patent
Jordan

(10) Patent No.: US 11,841,330 B2
(45) Date of Patent: Dec. 12, 2023

(54) SENSOR PROBE ASSEMBLY

(71) Applicant: Physik Instrumente (PI) GmbH & Co. KG, Karlsruhe (DE)

(72) Inventor: Scott Jordan, Gilroy, CA (US)

(73) Assignee: Physik Instrumente (PI) GmbH & Co. KG, Karlsruhe (DE)

( * ) Notice: Subject to any disclaimer, the term of this patent is extended or adjusted under 35 U.S.C. 154(b) by 332 days.

(21) Appl. No.: 15/733,958

(22) PCT Filed: Jun. 17, 2019

(86) PCT No.: PCT/IB2019/055059
§ 371 (c)(1),
(2) Date: Dec. 1, 2020

(87) PCT Pub. No.: WO2019/244010
PCT Pub. Date: Dec. 26, 2019

(65) Prior Publication Data
US 2021/0231578 A1    Jul. 29, 2021

Related U.S. Application Data

(60) Provisional application No. 62/687,376, filed on Jun. 20, 2018.

(51) Int. Cl.
*G01N 21/95* (2006.01)
*G01B 7/14* (2006.01)
(Continued)

(52) U.S. Cl.
CPC .......... *G01N 21/9501* (2013.01); *G01B 7/14* (2013.01); *G01D 5/24* (2013.01); *G01Q 60/24* (2013.01)

(58) Field of Classification Search
CPC ........ G01B 7/14; G01D 5/24; G01N 21/9501; G01N 21/956; G01Q 20/04; G01Q 60/24;
(Continued)

(56) References Cited

U.S. PATENT DOCUMENTS 3,447,071 A    5/1969   Webb
5,574,278 A *  11/1996  Poirier .................. G01Q 20/04
                                                    250/307

(Continued)

FOREIGN PATENT DOCUMENTS

DE    202016006669 U1    8/2017
EP    2641704 A1         9/2013
(Continued)

OTHER PUBLICATIONS

Korean Patent Office Action for Application No. 10-2021-7001180 dated May 23, 2022 (15 pages including English translation).
(Continued)

*Primary Examiner* — Tri T Ton
(74) *Attorney, Agent, or Firm* — Michael Best & Friedrich LLP

(57) ABSTRACT

A sensor probe assembly includes a probe, and a sensor assembly coupled to the probe. The sensor assembly measures a physical or electrical characteristic of a surface that the probe is near to or in contact with. The sensor assembly is symmetrically disposed around a center axis of the probe.

22 Claims, 3 Drawing Sheets

(51) Int. Cl.
*G01D 5/24* (2006.01)
*G01Q 60/24* (2010.01)

(58) Field of Classification Search
CPC ........ G01Q 70/02; G01Q 70/06; G01Q 70/10; H01L 22/12
USPC ...................... 356/237.1–237.6, 239.1–239.8
See application file for complete search history.

(56) References Cited

U.S. PATENT DOCUMENTS

| | | | |
|---|---|---|---|
| 5,982,166 A | 11/1999 | Mautz | |
| 6,449,853 B1 * | 9/2002 | Brueggemann | G01D 5/2412 33/534 |
| 6,507,017 B1 | 1/2003 | Naaman et al. | |
| 6,668,628 B2 | 12/2003 | Hantschel et al. | |
| 6,873,165 B2 | 3/2005 | Lee et al. | |
| 7,298,536 B2 | 11/2007 | McCann et al. | |
| 7,427,868 B2 | 9/2008 | Strid et al. | |
| 7,627,208 B2 | 12/2009 | Kuroiwa | |
| 9,127,929 B2 * | 9/2015 | Siercks | G01B 11/005 |
| 2006/0152232 A1 | 7/2006 | Shvets et al. | |
| 2007/0144244 A1 * | 6/2007 | Ray | G01Q 10/045 250/306 |
| 2015/0176969 A1 | 6/2015 | Jensen | |
| 2016/0265995 A1 * | 9/2016 | Wang | H03M 3/39 |

FOREIGN PATENT DOCUMENTS

| | | | |
|---|---|---|---|
| GB | 2454805 A | 5/2009 | |
| JP | H0252172 A | 2/1990 | |
| JP | H06249612 A | 9/1994 | |
| JP | 2003019451 A | 1/2003 | |
| JP | 2005308455 A | 11/2005 | |
| JP | 2008051547 A | 3/2008 | |
| JP | 2010010116 A | 1/2010 | |
| WO | 9964909 A1 | 12/1999 | |

OTHER PUBLICATIONS

International Search Report and Written Opinion for Application No. PCT/IB2019/055059 dated Nov. 21, 2019 (9 pages).
Japanese Patent Office Action for Application No. 2020/569898 dated Mar. 2, 2022 (11 pages including English translation).
European Patent Office Action for Application No. 19761946.3, dated Jan. 9, 2023 (6 pages).

* cited by examiner

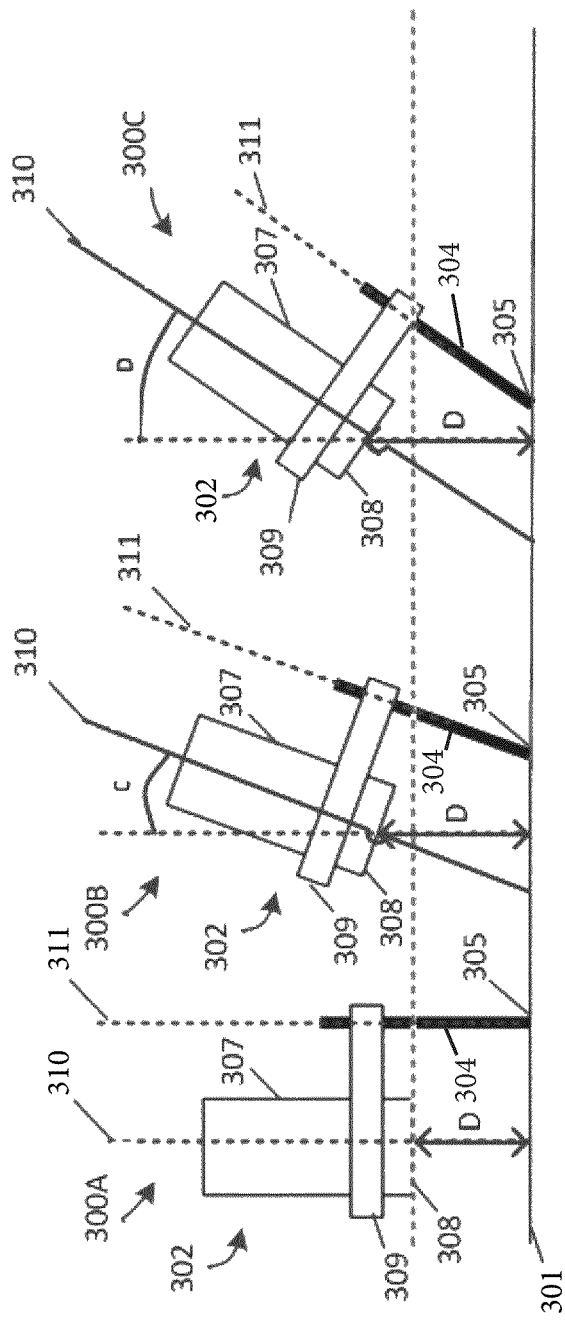
FIG. 3 - Prior Art

SENSOR PROBE ASSEMBLY

CROSS-REFERENCE TO RELATED APPLICATIONS

This application is a national phase filing under 35 U.S.C. § 371 of International Application No. PCT/IB2019/055059, filed Jun. 17, 2019, which claims priority to U.S. Provisional Application No. 62/687,376, filed Jun. 20, 2018, the entire contents of which are incorporated herein by reference.

FIELD OF THE INVENTION

The present invention relates to probe assemblies, in particular distance or proximity sensor probe assemblies having both a probe and sensor assembly, wherein the probe emits or receives electromagnetic or material quantities to or from a substrate, and the sensor measures or allows control of distance or separation.

BACKGROUND

Micro-fabrication processes have allowed for the miniaturization of various components, devices, and systems on micrometer scales and smaller. Such processes are used, for example, for fabricating integrated circuits (ICs), micro-electro-mechanical systems (MEMS), and other microstructures. A recent advancement is that processes may include the fabrication of integrated optical components, devices, and systems integrated with ICs, MEMS, and the like on the same chip to provide various useful functions.

The fabrication of such devices generally includes wafer-level fabrication processes. Often many individual devices are made together on one substrate and then singulated into separated devices (dice) toward the end of fabrication. The individual devices/chips are then tested and packaged.

In fabrication of integrated electronic circuits (ICs), a portion of the IC testing may be performed at the wafer level prior to separation of the dice. This wafer level optical testing may be used in early identification of defects in optical components and devices. However, as such defects may be on a micro to nanoscopic scale, accuracy in the testing equipment (for example, the wafer prober) is essential. This includes the position of the probe relative to the surface of the wafer, as the probe readings may be inaccurate due to geometric offsets when the probe's angular orientation is adjusted or optimized.

When such probes are further coupled to one or more sensors configured to measure a characteristic of the wafer, these offsets may further negatively impact testing results. In particular, when the distance between wafer and probe is measured or controlled by distance or proximity sensors integrated into the test fixturing some distance away from the probe, any angular adjustment will result in different distance changes at the probe versus the sensor. Attempting to maintain a constant separation at the sensor can lead to a collision between probe and wafer.

SUMMARY

Accordingly, embodiments described herein provide, among other things, a sensor probe assembly for minimal surface measurement inaccuracies due to geometric offsets when angular adjustments are required, or when the surface is wavy or wedged and presents a varying separation. One exemplary embodiment provides a sensor probe assembly including a probe and a sensor assembly. The sensor assembly is configured to measure a physical or electrical characteristic of a surface that the probe is near to or in contact with. The sensor assembly is symmetrically disposed around a center axis of the probe.

BRIEF DESCRIPTION OF THE DRAWINGS

The accompanying figures, where like reference numerals refer to identical or functionally similar elements throughout the separate views, together with the detailed description below, are incorporated in and form part of the specification, and serve to further illustrate embodiments of concepts that include the claimed invention and explain various principles and advantages of those embodiments.

FIG. 3 illustrates various positions of a conventional sensor probe assembly.

Figure 1:
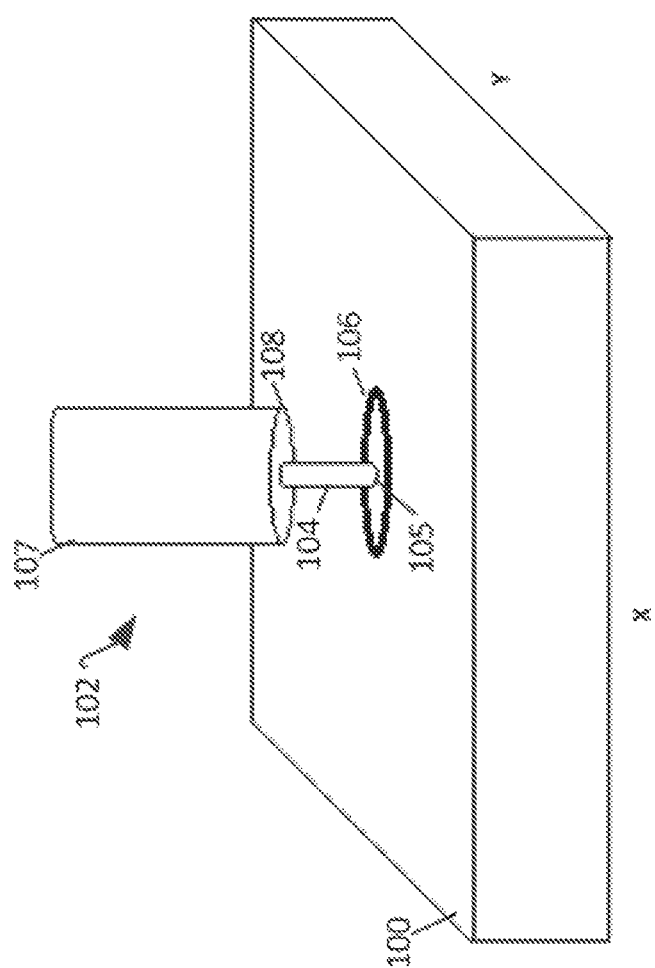
FIG. 1 illustrates a sensor probe assembly in accordance with one embodiment.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

The apparatus and method components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

DETAILED DESCRIPTION

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways. For ease of description, some or all of the example systems presented herein are illustrated with a single example of each of its component parts. Some examples may not describe or illustrate all components of the systems. Other example embodiments may include more or fewer of each of the illustrated components, may combine some components, or may include additional or alternative components.

FIG. 1 illustrates a surface 100 of an object to be measured (e.g., a silicon wafer), and a sensor probe assembly 102. The sensor probe assembly 102 includes a probe 104 and a sensor assembly 107 coupled to the probe 104. The probe 104 includes a tip 105 configured to interact with the surface 100. The probe 104 may be an optical probe/fiber or fiber array configured to optically interact with components of the surface 100 such as a component 106. For example, the probe 104 may provide and/or receive localized laser light to the surface 100 and/or the component 106. The component 106 may be, for example, an integrated circuit or various other components. In some embodiments, the probe 104 may be configured to electrically interact (as opposed to optically interact) with one or more components of the surface 100. The probe 104 may be an atomic-force probe or other probe of surface, electromagnetic or other material characteristics. The term "probe" as described herein denotes any device that may be placed near to or in contact with a surface, and that may be used to interact with the surface. For example, the probe 104 may be used to emit and/or receive electromagnetic waves relative to the surface, or to emit or receive physical material (e.g., droplets, continuous flow of material, sputtered atoms, etc.) relative to the surface. In some embodiments, the probe 104 may be used for dispensing material onto the surface, for example where a wavy/warped/wedged surface may need to be maintained at a set distance from the probe 104 and where angular motions of the probe 104 may be needed. In particular, the probe 104 may be used in additive manufacturing (3D printing) processes, or direct-write nanolithography processes.

In some embodiments, the probe 104 may be an array of multiple probes (for example, a fiber array) configured in close proximity to each other. In some embodiments, the probe 104 may be part of a sensor, distinct from the sensor assembly 107. In yet further embodiments, the probe assembly 102 includes and/or is communicatively coupled to additional components, for example an electronic processor (not shown). In some embodiments, the probe 104 may be held in a replaceable and/or interchangeable fixture of the assembly 102, allowing easy replacement and interchanging of the probe 104.

With continued reference to FIG. 1, the sensor assembly 107 includes one or more sensors (e.g., electrodes) configured to measure a distance to the surface 100, and/or to measure a physical or electrical characteristic of the surface 100 or a component of the surface 100 (e.g., component 106). In some embodiments, the sensor assembly 107 is configured to measure the distance to or characteristic(s) of the surface 100 via a face 108 (e.g., a lower face) of the sensor assembly 107 without making contact with the surface 100. The sensor assembly 107 may be further configured to generate and transmit an electronic signal corresponding to a distance or to a physical or electrical characteristic of the surface 100 or a component of the surface 100 to an electronic processor and related hardware and software components (not shown) of the assembly 102. Physical or electrical characteristics may be, for example, thickness, conductivity, magnetism, permittivity or other material or thin-film characteristics, optical and the like. The sensor assembly 107 may be, for example, a single plate capacitive displacement sensor and the face 108 may be its electrode plate. Different types of sensors may be realized depending on the application. For example, in some embodiments the sensor assembly 107 may be configured to sense Eddy current.

Figure 2:
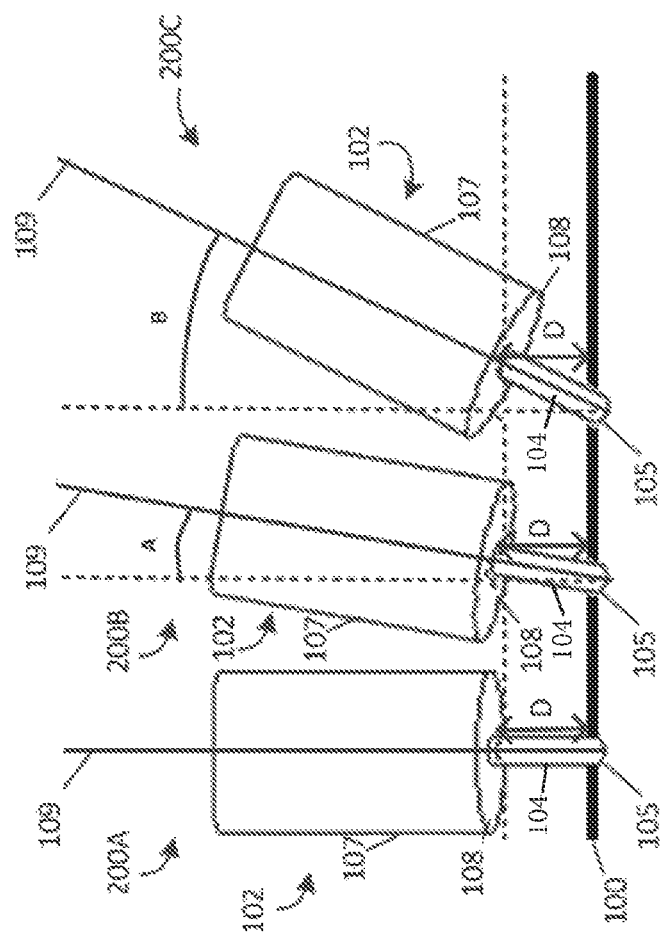
FIG. 2 illustrates various positions of the sensor probe assembly of FIG. 1

With reference to FIGS. 1 and 2, the sensor assembly 107 is disposed symmetrically around the probe 104 such that the sensor assembly 107 and the probe 104 share the same center axis 109 (FIG. 2). The sensor assembly 107 may completely surround the probe 104 or partially surround the probe 104. In some embodiments, the sensors of the sensor assembly 107 may be segmented around the probe 104 (in other words, each sensor of the sensor assembly 107 may be positioned around the probe 104). In some embodiments, each sensor of the sensor assembly 107 may be a different kind of sensor, or sensors of different types may be combined. In some embodiments, the sensor assembly 107 is symmetrical about a single angular axis. For example, when the assembly 102 is anticipated to tilt only in a single direction about an axis (for example, tilting the assembly 102 left and right along the X direction as shown in FIG. 1, while still maintaining the tip 105 at substantially the same displacement with respect to the surface 100), the sensor assembly 107 may consist of two sensors equidistant on either side of the assembly (i.e., one sensor on the left and one sensor on the right, as measured along the X direction as viewed in FIG. 1). In such embodiments, the geometric offset between the two equidistant sensors may be utilized to normalize the sensed data. For example, the sensors may be analyzed differentially, or may be operated at different frequencies and subsequently compared.

In some embodiments, the sensor assembly 107 is disposed symmetrically completely around the probe 104. It should be understood that although the sensor assembly 107 is illustrated as a cylinder, in further embodiments, other shapes and configurations of sensors may be implemented, for example an octagonal prism or hexagonal prism.

With continued reference to FIGS. 1 and 2, the probe 104 and the sensor assembly 107 work together in real time. The probe 104 is positioned within a center region of (or relative to) the sensor assembly 107 such that any geometric errors that would affect readings of the sensor assembly 107 (and, in some embodiments, the probe 104) are reduced. In the illustrated embodiment, the sensor assembly 107 is cylindrical in shape and includes a central longitudinal axis 109. The probe 104 extends along the central axis 109 and, in some embodiments, substantially or entirely through the sensor assembly 107.

In some embodiments, the assembly 102 may not engage or interact with the surface 100 completely perpendicularly. For example, the assembly 102 may be applied at an angle or tilt, due to abnormalities (bumps, crevices, waviness, wedge, and the like) in and on the surface 100 or simply due to the angle at which the assembly 102 is applied. As explained below, because of the particular arrangement of the probe 104 and the sensor assembly 107 sharing the same central axis 109 (FIG. 2), the geometric offset seen by the probe 104 and the sensor assembly 107 is minimized, as compared to assemblies where the probe 104 and the sensor assembly 107 each have their own separate central axes.

FIG. 2 illustrates the assembly 102 in a series of positions 200A, 200B, and 20C. Due to the central axis of the probe 104 and sensor assembly 107 being approximately the same, when the assembly 102 is tilted at a first angle A (position 200B) or at a second angle B (position 200C) while the tip 105 of the probe 104 is applied to the surface 100, any geometric offset that would be experienced by both the probe 104 and the sensor assembly 107 would be roughly the same.

Additionally, the sensor assembly 107 (specifically the face 108 of the sensor assembly 107) generally remains at an average distance D away from the surface 100 when the tip 105 of the probe 104 is applied to the surface 100. Even when the assembly is applied at a tilt (for example, as illustrated in positions 200B and 200C), the distance D defined as extending perpendicularly from the surface 100 to the intersection of the probe 104 and the face 108 remains roughly the same on average.

It should be understood that, in some embodiments, the center axis 109 is not center to the assembly 102. In other words, the axis 109 in which the probe 104 and the sensor assembly 107 are both positioned on may not be the same center axis as other components of the assembly 102, for example, a housing enclosing the assembly 102 (not shown).

In contrast to FIG. 2, FIG. 3 illustrates a conventional assembly 302, in a series of positions 300A, 300B, and 300C. The assembly 302 includes a probe 304 and a sensor assembly 307. The probe 304 includes a tip 305 configured to interface with a surface 301 while the sensor assembly 307 includes a face 308. The probe 304 and the sensor assembly 307, unlike the probe 104 and the sensor assembly 107, are positioned at a distance from each other (in the illustrated embodiment, via an arm 309) such that a center axis 310 of the sensor assembly 307 is separate from a center axis 311 of the probe 304. Because the probe 304 and the sensor assembly 307 are positioned on separate center axes 310 and 311 respectively, when the assembly 302 is tilted at a first angle C (position 300B) or at a second angle D (position 300C) while the tip 305 of the probe 304 is applied to the surface 301, the geometric offset experienced by the sensor assembly 307 in reference to the surface 301 is significantly greater than that experienced by the probe 304.

Additionally, unlike in the assembly 102, when the assembly 302 is applied at a tilt (for example, as illustrated in positions 300B and 300C), the distance D extending perpendicularly from the surface 301 increases significantly, which may result in inconsistent and/or un-normalized data. In the case where the distance between the probe 304 and the surface 301 is to be controlled by the sensor assembly 107, the resulting differential due to the geometric offset may result in collisions.

Thus, the invention provides, among other things, a sensor probe assembly 102 for minimal surface measurement inaccuracies due to geometric offsets. The sensor probe assembly 102 may be used for example in servo controls in order to maintain a desired set-point, as well as in scanned-probe metrology, such as atomic force microscopy and scanned-probe profilometry, by providing a means for measuring an absolute distance to a substrate, maintaining a more consistent distance from the substrate during angular adjustments or due to transverse motions of the probe assembly or the substrate in the presence of surface waviness, wedge etc., and with minimized offset between the sensor and the probing device.

Although the disclosure has been described in detail with reference to certain preferred embodiments, variations and modifications exist within the scope and spirit of one or more independent aspects of the disclosure as described.

What is claimed is:

1. A sensor probe assembly comprising:
   an optical probe configured to be positioned near to or in contact with a surface and to optically interact with the surface; and
   a sensor assembly coupled to the optical probe and including a face, the sensor assembly being configured to measure a distance to the surface via the face without making contact with the surface, and the sensor assembly being a single plate capacitive displacement sensor and the face being its electrode plate;
   wherein the sensor assembly is symmetrically disposed around a center axis of the optical probe, wherein the sensor assembly is configured to measure the distance to the surface at least substantially independently of an angle of the optical probe relative to the surface, and wherein the distance is measured from a center of the face of the sensor assembly to the surface.

2. The assembly of claim 1, wherein the sensor assembly includes more than one sensor, wherein the sensors of the sensor assembly are symmetrically disposed about the center axis of the optical probe.

3. The assembly of claim 1, wherein the sensor assembly includes a single annular sensor or symmetrically distributed sensor surrounding the optical probe.

4. The assembly of claim 1, wherein the face is a lower face.

5. The assembly of claim 1, wherein the optical probe is held in a replaceable fixture.

6. The assembly of claim 1, wherein the optical probe is an emitter or receiver of electromagnetic or material emissions.

7. The assembly of claim 1, wherein the optical probe comprises an array of optical probes.

8. The assembly of claim 7, wherein the array of optical probes includes a fiber array of optical probes.

9. The assembly of claim 1, wherein the sensor assembly is also configured to measure at least one of a thickness, conductivity, magnetism, or permittivity of the surface.

10. The assembly of claim 1, wherein the sensor assembly is configured to measure the distance without the optical probe making contact with the surface.

11. The assembly of claim 1, wherein the sensor assembly is additionally configured to measure at least one of a thin-film characteristic of the surface or an Eddy current.

12. The assembly of claim 1, wherein the sensor assembly is additionally configured to measure an optical characteristic of the surface.

13. The assembly of claim 1, wherein the sensor assembly includes a plurality of sensors that are segmented around the optical probe.

14. The assembly of claim 1, wherein the sensor assembly includes two sensors equidistant on either side of the assembly.

15. The assembly of claim 1, wherein the sensor assembly is of a type of sensor assembly configured only to measure the distance to the surface, and is additionally positioned so as to only measure the distance to the surface.

16. The assembly of claim 1, wherein the sensor assembly is arranged to render a controlled distance of the probe relative to the surface substantially insensitive to a varying angle of the probe relative to the surface.

17. A method of using the assembly of claim 16, wherein the method comprises measuring and controlling the distance to the surface with the face, and using the probe to optically interact with the surface.

18. The method of claim 17, wherein the method includes varying the angle of the probe relative to the surface, without substantially changing the distance between the face and the surface.

19. The method of claim 18, wherein the method does not include measuring an angle of the probe relative to the surface.

20. The assembly of claim 1, wherein the distance is configured to remain roughly the same as the angle is changed.

21. The assembly of claim 1, wherein the distance is configured to remain exactly the same as the angle is changed.

22. The assembly of claim 1, wherein the distance is perpendicular to the surface regardless of the angle.

* * * * *